United States Patent
Watanabe et al.

[11] Patent Number: 5,844,311
[45] Date of Patent: Dec. 1, 1998

[54] MULTICHIP MODULE WITH HEAT SINK AND ATTACHMENT MEANS

[75] Inventors: Hideki Watanabe, Hadano; Kenichi Kasai, Ushiku; Tositada Netsu; Hiroyuki Hidaka, both of Hadano; Osamu Yamada, Hiratsuka; Mitsunori Tamura, Hadano, all of Japan

[73] Assignee: Hitachi, Ltd., Tokyo, Japan

[21] Appl. No.: 972,034

[22] Filed: Nov. 17, 1997

Related U.S. Application Data

[63] Continuation of Ser. No. 626,939, Apr. 3, 1996, abandoned.

[30] Foreign Application Priority Data

Apr. 4, 1995 [JP] Japan .................................. 7-078584

[51] Int. Cl.$^6$ ...................................................... H01L 23/34
[52] U.S. Cl. ........................... 257/712; 257/723; 257/710
[58] Field of Search .................................. 257/723, 712, 257/710, 678, 730; 361/715, 718

[56] References Cited

U.S. PATENT DOCUMENTS

| | | | |
|---|---|---|---|
| 4,853,762 | 8/1989 | Ewer et al. | 257/723 |
| 4,949,219 | 8/1990 | Moriizumi et al. | 257/732 |
| 4,975,766 | 12/1990 | Umezaw | 257/723 |
| 5,276,289 | 1/1994 | Sadoh et al. | 257/723 |
| 5,329,160 | 7/1994 | Miura et al. | 257/710 |
| 5,455,457 | 10/1995 | Kurokawa | 257/710 |

FOREIGN PATENT DOCUMENTS 2-281747 11/1990 Japan .

OTHER PUBLICATIONS

IBM Hournal of Research and Development, vol. 35, No. 3, May, 1991, "IBM System/390 Air–Cooled Alumina Thermal Conduction Module", J. Knickerbocker et al, pp. 330–340.

*Primary Examiner*—Olik Chaudhuri
*Assistant Examiner*—Nathan K. Kelley
*Attorney, Agent, or Firm*—Fay,Sharpe,Beall,Fagan,Minnich & McKee

[57] ABSTRACT

There is disclosed a multichip module having a sealing-cooling structure which achieves a high packaging density, high sealing-connection reliability, a low manufacturing cost and a high cooling ability. A frame 15, conforming in thermal expansion coefficient to a substrate 11, is soldered at one surface thereof to that surface of the substrate 11 on which semiconductor devices 12 are mounted. The frame 15 is fastened or fixedly secured at the other surface thereof to a lid member 17 by bolts 10 or means without any heat treatment of the whole of the module.

6 Claims, 3 Drawing Sheets

MULTICHIP MODULE WITH HEAT SINK AND ATTACHMENT MEANS

This is a continuation application of Ser. No. 08/626,939, filed Apr. 3, 1996, now abandoned.

BACKGROUND OF THE INVENTION

This invention relates generally to a multichip module, and more particularly to a multichip module with a sealing-cooling structure used in an electronic computer or the like having high-performance semiconductor devices mounted thereon.

Recently, electronic computers have been required to have a high-performance and low-cost design, and also the packaging of semiconductor devices has been more and more required to have a high-density design (high-performance design) and a low-cost design.

In the commonest method of achieving a high-density packaging, a plurality of high-performance semiconductor devices are mounted on a ceramics substrate of a high-speed and high-density design, and a sealing-cooling mechanism is provided on the ceramic substrate (wiring board), thereby forming a multichip module. However, with the high-performance design of the semiconductor devices, heat of high temperature is generated from the semiconductor devices, and therefore it has become important to provide a cooling mechanism so as to ensure a stable operation of the semiconductor devices. This is true also with C-MOS semiconductors which have now been extensively used instead of bipolar semiconductors heretofore mainly used. It is also important to provide a sealing mechanism which protects the semiconductor devices mounted on the substrate, which mechanically holds the cooling mechanism, and which maintains the performance of the cooling mechanism.

One example of a multichip module having such important sealing-cooling structure will be described below.

Japanese Patent Unexamined Publication No. 2-281747 discloses a multichip module having sealing-cooling structure as shown in FIG. 3. More specifically, a plurality of semiconductor devices 32 are mounted on a substrate 31 made of a mullite ceramic material. This mullite ceramic material conforms in thermal expansion coefficient to the semiconductor devices 32, and has such a low dielectric constant that it is excellent in high-speed signal transmission. Input-output pins 33 are formed on a rear surface of the substrate 31. A frame 35, made of a Fe—Ni alloy material conforming in thermal expansion coefficient to the substrate 31, is soldered as at 38 to a cap plate 34 of an aluminum nitride ceramic material (which has high thermal conductivity, and conforms in thermal expansion coefficient to the substrate 31), thereby forming a cap, and this cap is placed on the substrate 31 to cover the same, and is sealed by solder 39 at their peripheral portions. Thermal conduction means, called comb teeth 36a and 36a, are provided between each semiconductor device 32 and the cap plate 34 (each of which comb teeth corresponds to each of the semiconductor devices 32), and heat, generated by the semiconductor devices 32, is transferred to the cap plate 34 through these thermal conduction means 36a and 36b. In order to enhance the heat transfer (thermal conduction) efficiency, He gas is filled in the interior. A water-cooled heat sink 37 is fixedly mounted on an upper surface of the cap plate 34 through thermally-conductive grease 30, and serves to radiate heat collected in the cap plate 34. Both of the heat sink 37 and the cap plate 34 are fixed by means of clamps 40 and plate springs 41 through a spacer 42 disposed on the heat sink.

In this construction, since the dimensions required for the sealing are very small, the size of the module is small, and when forming a processor by mounting many multichip modules on a mother board, the substantial packaging density of the semiconductor devices can be made high, and besides since the increase of the size of the substrate is kept to a small level, the cost of manufacture of the substrate can be advantageously reduced. Furthermore, by selecting the suitable material and by using the solder-connecting process, the reliability of the solder-connection for module-sealing purposes is made extremely high.

Another example of a sealing-cooling structure of a multichip module as shown in FIG. 4 is disclosed in a report entitled "IBM System/390 air-cooled alumina thermal conduction module" appearing in "IBM Journal of Research and Development. Vol 35, No. 3, May 91". More specifically, a plurality of semiconductor devices 42 are mounted on a substrate 41 made of an alumina ceramic material. Input-output pins 43 are formed on a rear surface of the substrate 41. A cap plate 44, made of aluminum of high thermal conductivity, is placed on the substrate 41 to cover the same, and the cap plate 44 and the substrate 41 are fastened together at their peripheral portions by bolts 40 through a C-ring 49, thereby sealing the module. Thermal conduction means, called pistons 46, is provided between each semiconductor device 42 and the cap plate 44 (each piston corresponds to each of the semiconductor devices 42), and heat, generated from the semiconductor devices 42, is transferred to the cap plate 44 through these pistons 46. In order to enhance the heat transfer (thermal conduction) efficiency, thermally-conductive oil is filled in the interior. An air-cooled heat sink 47 is fixedly mounted on an upper surface of the cap plate 44, and serves to radiate heat collected in the cap plate 44.

In this construction, the sealing-cooling structure is formed by inexpensive materials, and the assembling of the module, as well as the opening of the sealed structure for exchange of the semiconductor devices, can be effected easily.

The sealing-cooling structure of the multichip module must meet the requirements of (1) a high packaging density, (2) high sealing-connection reliability, (3) a low manufacturing cost and (4) a high cooling ability. In view of these, the above conventional structures have the following problems.

In the construction of Japanese Patent Unexamined Publication No. 2-281747, in order to ensure the reliability of the solder connection for sealing purposes, the selection of the materials for the sealing-cooling structure is much limited, and it is necessary to use the aluminum nitride ceramics material which is expensive and is relatively difficult to be worked, which has resulted in the problem that the manufacturing cost is high. And besides, a heat transfer path from each semiconductor device to the water-cooled heat sink is so long that the semiconductor devices, which tend to generate a larger amount of heat, can not be properly cooled. Furthermore, when opening and re-sealing the solder-sealed structure, the whole of the module must be heated, and the solder must be removed, and solder must be supplied again, and therefore these operations are cumbersome, and can not be carried out in a short period of time.

On the other hand, in the structure disclosed in the report appearing in "IBM Journal of Research and Development. Vol 35, No. 3, May 91", the sealing dimension in a direction of the plane of the mother board is large, and when forming a processor by mounting a plurality of modules on the mother board, there has encountered a problem that the substantial packaging density of the semiconductor devices can not be made high. And besides, special machining of the substrate is required for providing the sealing. More specifically, the outer peripheral portion of the substrate must be ground and polished (see FIG. 4), and the substrate must have a sufficient mechanical strength to withstand a pressure applied from the C ring of metal (see FIG. 4), and therefore the substrate has a relatively large size. This has resulted in a problem that the cost of manufacture of the substrate is increased.

SUMMARY OF THE INVENTION

With the above problems in view, it is an object of this invention to provide a multichip module having a sealing-cooling structure which achieves (1) a high packaging density, (2) high sealing-connection reliability, (3) a low manufacturing cost and (4) a high cooling ability.

According to the present invention, there is provided a multichip module comprising:

a substrate having a plurality of semiconductor devices mounted on one side thereof, and input/output pins formed on the other side of the substrate;

a frame made of a material conforming to the substrate with respect to thermal expansion coefficient;

a lid member having cooling means;

thermal conduction means provided between each of the plurality of semiconductor devices and the lid member;

means for fixedly securing the substrate and the frame together; and means for connecting the frame and the lid member together.

In the present invention, the following advantageous effects are achieved:

(1) The frame and the substrate conform to each other with respect to thermal expansion coefficient, and therefore even if the two are fixedly secured together by fixing means involving a heat treatment, such as soldering, the high connection reliability can be obtained.

(2) Although the frame and the lid member do not necessarily conform to each other regarding thermal expansion coefficient, the two are fastened or fixed together at room temperature, and therefore there occurs no problem. The lid member is constituted by the heat sink itself, and therefore even when the power is turned on and off during the actual operation, the temperature change of the frame and the lid member is small, and the thermal expansion difference between the two is small, and therefore the mechanical fixing through the packing or the fixing by welding is highly reliable.

(3) The dimensions of the substrate required for sealing the module are very small, and therefore the size of the substrate will not be increased, and besides no special machining or working is needed. Therefore, the cost of manufacture of the substrate can be reduced.

(4) The frame is made of a Ni—Fe alloy, and the lid member is made of a metal material such as copper or aluminum. Therefore, the frame and the lid member can be easily worked or machined, and their materials are inexpensive, so that the cost of manufacture of the sealing-cooling members is low.

(5) The sealing of the module, the opening of the sealed structure, and the re-sealing of the module can be carried out in a short period of time, and therefore these operations can be effected rapidly, and the manufacturing cost can be reduced.

(6) Although the multichip module is larger in size than the substrate because of the provision of the sealing structure, the fastening structure is provided in a plane above the substrate, and therefore other parts (for example, a LSI package, a power feed part, a capacitor and so on which are smaller in height than the projected portion (flange) of the frame) can be provided around the substrate on a mother board which is a host wiring medium, and therefore the substantial packaging density of the semiconductor devices will not be reduced.

(7) The sealing-cooling structure is provided on the upper side of the substrate, and therefore the thickness tolerance of the ceramics substrate which is relatively hard to be worked with an accurate dimension tolerance can be disregarded, and the sealing-cooling structure can be assembled with high mechanical precision, thereby enhancing the cooling ability and the sealing reliability.

(8) Since the sealing-cooling structure is provided on the upper side of the substrate, no extra structural member is provided on the rear side of the substrate, and therefore the input/output pins for engagement with the mother board (host wiring medium) do not need to be unduly long, so that high-speed signal transmission can be achieved.

(9) A heat transfer path from each semiconductor device to the heat sink is short, and therefore the semiconductor devices, which tend to generate a larger amount of heat, can be efficiently cooled.

DESCRIPTION OF THE PREFERRED EMBODIMENTS

Preferred embodiments of multichip modules of the present invention having a sealing-cooling structure will now be specifically described with reference to FIGS. 1A, 1B and 2.

Figure 1A:
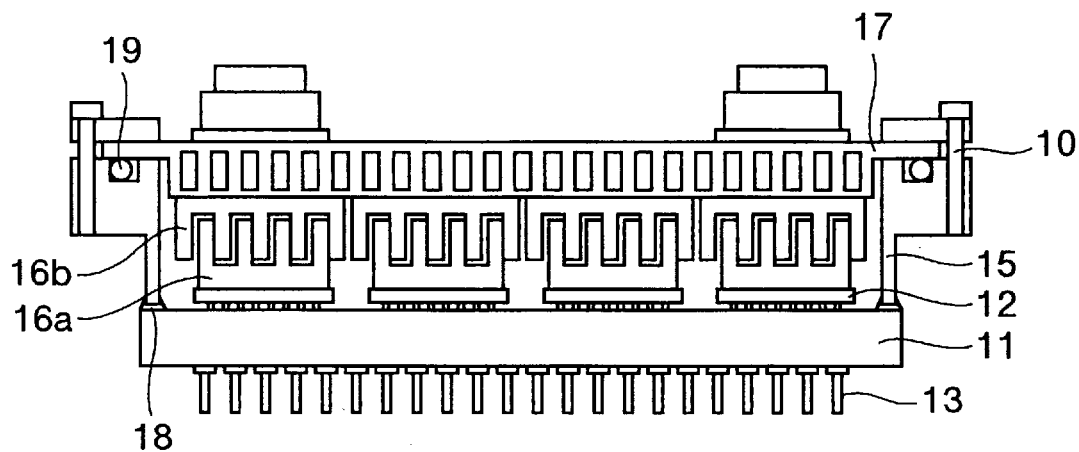
FIG. 1A is a cross-sectional view showing a multichip module having a sealing-cooling structure according to one preferred embodiment of the present invention.
Figure 1B:
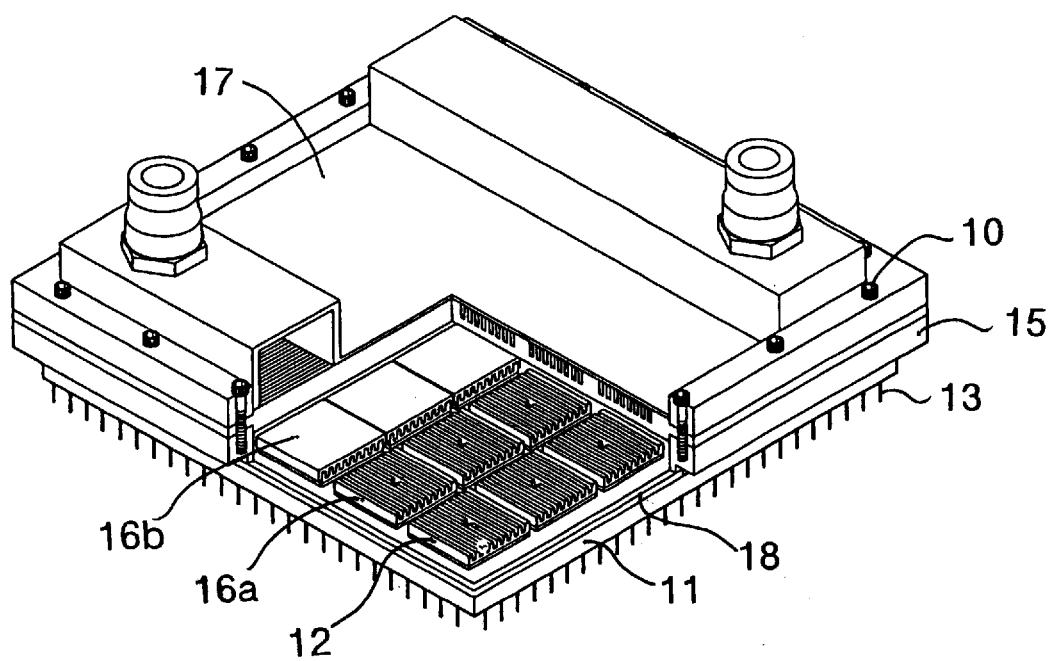
FIG. 1B is a perspective view of the multichip module of FIG. 1A.

FIGS. 1A and 1B are a cross-sectional view and a perspective view both showing a construction of one preferred embodiment of the invention, respectively. A plurality of semiconductor devices 12 are mounted on a substrate 11 made of a glass ceramics material. The glass ceramics material conforms in thermal expansion coefficient to the semiconductor device 12, and has a low dielectric constant and a low wiring resistance, and therefore is more excellent in high-speed signal transmission. Input/output pins 13 are formed on a rear surface of the substrate 11. A frame 15, made of a Ni—Fe alloy (42% Ni-balance Fe) conforming in thermal expansion coefficient to the substrate 11, is soldered (as at 18) at its lower surface to that side or surface of the substrate 11 on which the semiconductor devices 12 are mounted. A peripheral flange is formed at an upper portion of the frame 15, and extends outwardly beyond an outer periphery of the substrate 11. Another flange extends from an outer periphery of a water-cooled heat sink 17 at its upper portion. The two flanges are fastened together by bolts 10, with an O-ring 19 of rubber held therebetween, thereby sealing the module. Thermal conduction means, called comb teeth members 16a and 16b, are provided between each semiconductor device 12 and the water-cooled heat sink 17 (each of which comb teeth corresponds to each semiconductor device 12), and heat, generated by the semiconductor devices 12, is transferred to the water-cooled heat sink 17 through these thermal conduction means 16a and 16b. In order to enhance the heat transfer (thermal conduction) efficiency, thermally-conductive oil is filled in the interior.

Figure 2:
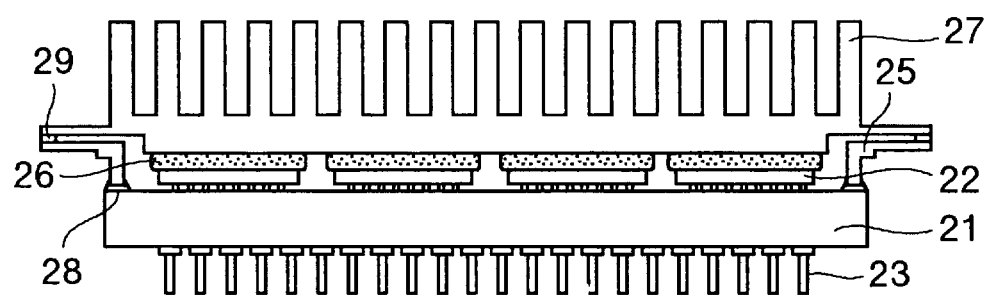
FIG. 2 is a cross-sectional view showing another multichip module having a sealing-cooling structure according to another preferred embodiment of the invention.
Figure 3:
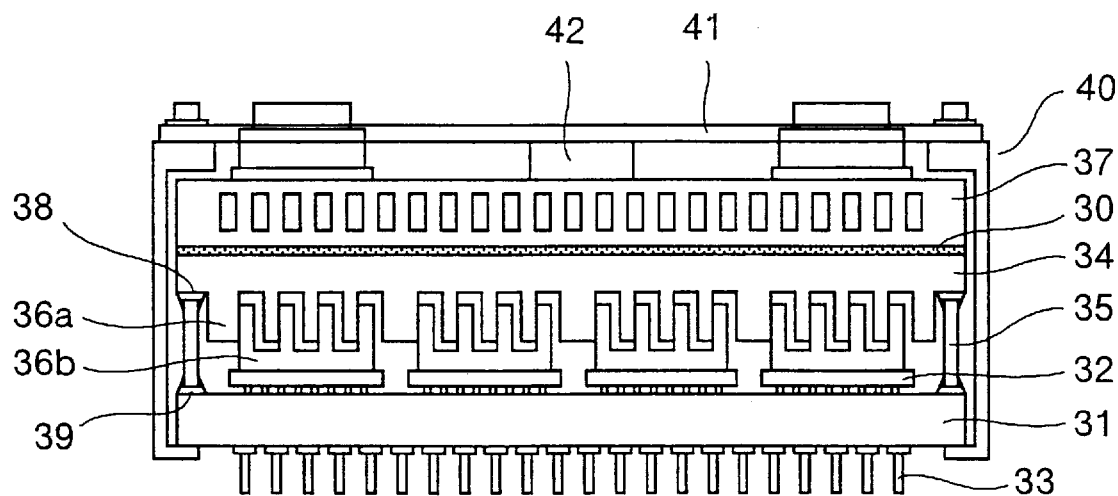
FIG. 3 is a cross-sectional view showing a conventional multichip module having a sealing-cooling structure.
Figure 4:
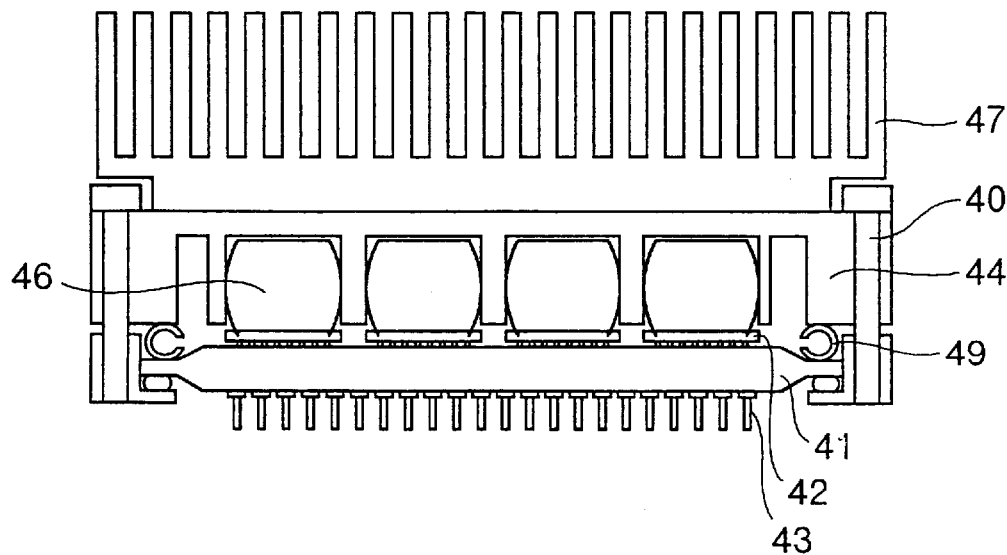
FIG. 4 is a cross-sectional view showing another conventional multichip module having a sealing-cooling structure.

FIG. 2 is a cross-sectional view showing a construction of another preferred embodiment of the invention. A plurality of semiconductor devices 22 are mounted on a substrate 21 made of a mullite ceramics material. Input/output pins 23 are formed on a rear surface of the substrate 22. A frame 25, made of a Ni—Fe alloy conforming in thermal expansion coefficient to the substrate 21, is soldered (as at 28) at its lower surface to that surface of the substrate 21 on which the semiconductor devices 21 are mounted. A peripheral flange is formed at an upper portion of the frame 25, and extends outwardly beyond an outer periphery of the substrate 21. An upper surface of the frame 25 is flat, and the flange of the frame 25 is reduced in thickness at its outer peripheral portion (the thickness of which thinned flange portion is 0.2–0.5 mm). An air-cooled fin member 27, having a thin flange formed at its outer periphery thereof, is placed on the frame 25 to cover the same. The flange of the frame 25 and the flange of the air-cooled fin member 27 are fixedly secured together at their outer peripheral portions by seam welding as at 29, thereby sealing the module. For opening the sealed structure, the seam-welded portion is ground, and for re-sealing the structure, the outer peripheral portions of the two flanges are again seam-welded. The flanges have a predetermined length of 5–10 mm, and the seal-opening and re-sealing operation can be carried out several times. Thermally-conductive greases 26 are filled in between each semiconductor device 22 and the air-cooled fin member 27 (each of which greases corresponds to each of the semiconductor devices 22), and heat, generated by the semiconductor device 26 is transferred to the air-cooled fin member 27 through the thermally-conductive greases 26.

In the above embodiments, the dimensions of the substrate required for sealing the module are small, and therefore the increase of the size of the substrate can be kept to a small level, and besides no special machining or working is needed. Therefore, the cost of manufacture of the substrate can be reduced. The sealing structure, projecting outwardly beyond the substrate, is disposed above the substrate, and therefore a power supply structure and electronic parts of a small height, such as an LSI, a resistor and a capacitor, can be mounted on a mother board immediately adjacent to the substrate. Therefore, when forming a processor by mounting a plurality of modules on the mother board, the substantial packaging density of the semiconductor devices can be made high. And besides, since the sealing-cooling structure is constructed while using the component parts which are inexpensive, and can be easily machined or worked, the manufacturing cost can be reduced. Furthermore, since the sealing-cooling structure is provided above the substrate, a large thickness tolerance of the ceramics substrate does not need to be taken into consideration, and the sealing-cooling structure can be assembled with a small tolerance. Moreover, since the heat sink is used as a lid, a heat transfer path from each semiconductor device to the heat sink is shortened. With these effects, the high-performance cooling was able to be achieved, that is, the cooling ability of the structures of the invention was about 5–10 times higher than that obtained with the structure disclosed in Japanese Patent Unexamined Publication No. 2-281747. Since any extra structural member is provided on the rear side of the substrate, the length of electrical connection between the substrate and the mother board can be shortened, and this enables high-performance signal transmission. In the above embodiments, since the substrate and the frame conform in thermal expansion coefficient to each other, the reliability of the solder-connection between the two is high. And besides, although the frame and the lid member do not conform in thermal expansion coefficient to each other, the two are fastened together at room temperature, or bonded together by local heating, and therefore there is encountered no problem due to the thermal expansion difference between the two. The lid member is constituted by the heat sink itself, and therefore even when the power is turned on and off during the actual operation, the temperature change of the frame and the lid member is small, and the thermal expansion difference between the two is small, and therefore the mechanical fixing through the packing or the fixing by welding is highly reliable.

In the above embodiments, although the frame and the substrate are fixedly secured together by soldering, there can be used any other suitable fixing means involving a heat treatment of the whole of the module, such as glass bonding and a thermosetting adhesive. The connection between the frame and the lid member can be made by any other suitable means than the above-mentioned means, such as spot welding by an electron beam or the like, bonding by a cold setting adhesive, and can sealing. In the above embodiments, although the frame extends outwardly beyond the substrate, the invention also includes a construction in which the amount of the extending of the frame is minimized. For example, the flanges welded together (FIG. 2) may be bent upwardly. The materials for the structure members or parts are not limited to those described in the above embodiments, and any suitable materials can be used.

Although the present invention has been specifically described above by way of the preferred embodiments, the invention is not to be limited to the above embodiments, and various modifications can be made without departing from the scope of the invention.

In the present invention, there can be provided the multichip module having the sealing-cooling structure which enables the high packaging density of the semiconductor devices, can be manufactured at low cost, and has the high cooling performance and the high sealing reliability.

What is claimed is:

1. A multichip module comprising:

a substrate having a plurality of semiconductor devices mounted on one side thereof, and input/output pins formed on the other side of said substrate;

a frame made of a material conforming to said substrate with respect to thermal expansion coefficient;

a single integral lid member which is itself a heat sink, said lid member being made of a single material having a thermal expansion coefficient different from that of said substrate;

thermal conduction means provided between each of said plurality of semiconductor devices and said lid member;

means for fixedly securing said substrate and said frame together which means is accompanied with a heat treatment of the whole of said module; and means for connecting said frame and said lid member together which means is one of mechanical fastening means and fixedly-connecting means which is performed without any heat treatment of the whole of said module.

2. A multichip module according to claim 1, in which said fixedly-connecting means is one selected from the group consisting of soldering, glass bonding and bonding by a thermosetting adhesive.

3. A multichip module according to claim 1, in which said mechanical fastening means being performed through a packing interposed between said frame and said lid member, said packing being one of an O-ring of rubber and an O-ring of metal, and being one selected from the group consisting of bonding by a cold setting adhesive, seam welding and beam welding.

4. A multichip module according to claim 1, in which said connecting means is spaced apart from an outer peripheral portion of said substrate above a plane of said substrate.

5. A multichip module according to claim 1, in which said substrate is made of a ceramics material which is one selected from the group consisting of a glass ceramics material, a mullite ceramics material and an alumina ceramics material.

6. A multichip module according to claim 1, wherein said lid member is one of a water-cooled jacket and an air-cooled fin member.

* * * * *